US010333497B1

(12) United States Patent
Kumar et al.

(10) Patent No.: US 10,333,497 B1
(45) Date of Patent: Jun. 25, 2019

(54) CALIBRATION DEVICES FOR I/O DRIVER CIRCUITS HAVING SWITCHES BIASED DIFFERENTLY FOR DIFFERENT TEMPERATURES

(71) Applicant: GLOBALFOUNDRIES INC., Grand Cayman (KY)

(72) Inventors: Anil Kumar, Clifton Park, NY (US); Mahbub Rashed, Cupertino, CA (US); Sushama Davar, Santa Clara, CA (US); Navneet Jain, Milpitas, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/944,813

(22) Filed: Apr. 4, 2018

(51) Int. Cl.
*H03K 3/011* (2006.01)
*G06F 13/10* (2006.01)
*H03K 5/24* (2006.01)

(52) U.S. Cl.
CPC ........... *H03K 3/011* (2013.01); *G06F 13/102* (2013.01); *H03K 5/24* (2013.01)

(58) Field of Classification Search
CPC .............................. H03K 3/011; G06F 13/102
See application file for complete search history.

(56) References Cited

U.S. PATENT DOCUMENTS

| 6,097,113 | A | * | 8/2000 | Teraoka ................. H01L 27/092 257/E27.062 |
| 6,636,821 | B2 | | 10/2003 | Lawson |
| 7,479,800 | B1 | | 1/2009 | Vullaganti et al. |
| 8,149,014 | B2 | | 4/2012 | Chen et al. |
| 8,253,440 | B2 | | 8/2012 | Maddux et al. |
| 2004/0044808 | A1 | | 3/2004 | Salmon et al. |
| 2015/0227158 | A1 | * | 8/2015 | Sako ........................ G05F 1/561 323/313 |

\* cited by examiner

*Primary Examiner* — Daniel C Puentes
(74) *Attorney, Agent, or Firm* — Gibb & Riley, LLC; David A. Cain, Esq.

(57) ABSTRACT

A calibration circuit is connected to an input/output driver, a voltage bias generator is connected to the calibration circuit and the input/output driver, and a temperature sensor is connected to the voltage bias generator. The calibration circuit and input/output driver each include a bank of resistors and corresponding switches. Bodies of the switches are connected to the voltage bias generator, and the switches are biased by a bias signal output from the voltage bias generator. The calibration circuit includes a comparator device connected to the switches and to a reference resistor. Activation and deactivation of selected ones of the switches is made to match the reference resistor. Also, the voltage bias generator adjusts the bias signal when a temperature change is sensed by the temperature sensor. Thus, the switches change current flow as the bias signal changes, without changing which of the switches are activated or deactivated.

20 Claims, 4 Drawing Sheets

CALIBRATION DEVICES FOR I/O DRIVER CIRCUITS HAVING SWITCHES BIASED DIFFERENTLY FOR DIFFERENT TEMPERATURES

BACKGROUND

Field of the Invention

The present disclosure relates to calibration devices used with input/output (I/O) driver circuits, and more specifically to calibration devices for I/O driver circuits that have switches that are biased differently for different temperatures.

Description of Related Art

Circuits that transmit and receive data are generally referred to as input/output (I/O) devices. Calibration circuits are used to help I/O devices maintain proper voltages, both at cold startup, and as the temperature of the I/O device changes during transmit and receive operations. For example, calibration of I/O driver devices can be performed relative to an external or off-die resistor that does not experience the temperature variations that the I/O device experiences.

Therefore, high speed I/O drivers are often calibrated to the fixed impedance (e.g. 40 Ohm, 50 Ohm, etc.) of the external resistor. These drivers use binary weighted driver-banks to calibrate the impedance to the fixed external resistor. However, because such systems are binary (each resistor device within the bank is either off or on (0 or 1)), there is always a possibility that a large number of resistors within the driver bank can be switched at the same time, introducing undesirable noise in the I/O driver output.

For example, one binary code can be 0111, which can be become 1000, with just a small change in I/O device temperature. More specifically, a change from binary 0111 to binary 1000 in a 4-resistor bank would cause all members of the driver bank to switch, which could produce signal noise (especially if there is no calibration cycle allocated in the data-transmission protocol (e.g., DDR4, etc)). To address this issue, designers have used thermometer coding processes; however, such solutions increase design complexity of the pre-driver circuitry, increase the chip area consumed, and require balancing of signal routing from pre-driver to driver.

SUMMARY

Exemplary integrated circuit devices herein include (among other components) logic circuitry receiving and generating data signals, and an input/output driver electrically connected to the logic circuitry. The input/output driver has transmit and receive terminals that transmit and receive the data signals to and from the logic circuitry.

These structures also include a calibration circuit electrically connected to the input/output driver, a voltage bias generator electrically connected to the calibration circuit and the input/output driver, and a temperature sensor electrically connected to the voltage bias generator. The calibration circuit and the input/output driver include banks of resistors (at least one binary weighted bank) and corresponding switches. Bodies of the switches are electrically connected to the voltage bias generator, and the switches are biased by a bias signal output from the voltage bias generator. Additionally, the calibration circuit includes a comparator device electrically connected to the switches of the calibration circuit and to a reference resistor (a fixed impedance).

Activation and deactivation of selected ones of the switches is performed to match the reference resistor at startup. Also, the voltage bias generator adjusts the bias signal when a temperature change is sensed by the temperature sensor. Specifically, the voltage bias generator (in response to a temperature change output by the temperature sensor) starts a calibration procedure by sweeping the body bias voltage of the switches in the calibration circuit only, until the output impedance of the bank of resistors in the calibration circuit matches the impedance of the external resistor (as detected by the comparator). Once the impedance of the driver bank of the calibration circuit and the external resistor matches, the corresponding body bias voltage is then applied to all output drivers outside the calibration circuit. The calibration is linear in nature to compensate for temperature variations. Thus, the switches change current flow as the bias signal changes, and this change in the current flow caused by the bias signal changes adjusts how the calibration circuit calibrates the input/output driver, without changing which of the switches are activated or deactivated.

Further, activation and deactivation of the switches is performed when the input/output driver is performing a powering up operation; however, the voltage bias generator adjusts the bias signal based on temperature changes that occur after the input/output driver has completed the powering up operation. In other words, none of the switches are activated or deactivated after the input/output driver has completed the powering up operation because the change in the current flow through the resistors, caused by the bias signal changes, adjusts how the calibration circuit calibrates the input/output driver.

In some structures, the input/output driver and the calibration circuit are positioned on one substrate, but the reference resistor is on a different substrate separate from that one substrate.

Various methods herein include (among other processes) providing an input/output driver and connecting a calibration circuit to the input/output driver. The calibration circuit and input/output driver each include a bank of resistors (e.g., binary weighted bank) and corresponding switches. Such methods also connect a voltage bias generator to the calibration circuit and input/output driver by connecting bodies of the switches to the voltage bias generator. The switches are biased by a bias signal output from the voltage bias generator.

Further, these methods connect a temperature sensor to the voltage bias generator, connect a comparator device to the switches of the calibration circuit, and connect the comparator to a reference resistor. When forming such connections, the input/output driver and the calibration circuit can be positioned on a first substrate, and the reference resistor can be positioned on a different substrate separate from the first substrate.

The comparator device matches the resistance of the calibration circuit to the resistance of the reference resistor. The voltage bias generator adjusts the bias signal when a temperature change is sensed by the temperature sensor, and the switches change current flow as the temperature and the bias signal changes. Thus, the change in the current flow caused by the bias signal changes adjusts how the calibration circuit calibrates the input/output driver, without changing which of the switches are activated or deactivated.

Activation and deactivation of the switches occurs when the input/output driver is performing a powering up operation, but the voltage bias generator adjusts the bias signal based on temperature changes that occur after the input/output driver has completed the powering up operation. Thus, none of the switches are activated or deactivated after the input/output driver has completed the powering up operation.

BRIEF DESCRIPTION OF THE DRAWINGS

The embodiments herein will be better understood from the following detailed description with reference to the drawings, which are not necessarily drawn to scale and in which.

DETAILED DESCRIPTION

As noted above, with binary resistor banks used in calibration circuits for input/output (I/O) driver circuits, there is a possibility that a large number of resistors within the driver bank can be switched at the same time, introducing undesirable noise in the I/O driver output. In view of this, the structures and methods described herein provide calibration devices and operations for I/O driver circuits that have switches that are biased differently for different temperatures, instead of switching which resistors are active, and this eliminates the possibility of undesirable noise that can accompany the simultaneous switching of multiple resistors within driver banks.

More specifically, with devices and methods herein, when an I/O chip gets powered up, driver calibration operation happens using an external resistor. This generates a pure binary setting that is used to calibrate the I/O driver for specific combinations of process-corner, supply voltage (including voltage droop in the power supply), and initial temperature. Once the I/O chip is running and performing transmit and receive operations, the majority of the change in driver impedance happens due to temperature changes. However, rather than switching which resistors are on, and which are off, to adjust for temperature changes, instead the temperature change is calibrated with the devices disclosed herein using body bias (forward/reverse bias). In one example, up to 15% of driver calibration change can be accomplished through body biasing. This change is linear and does not change the binary code established at startup. With the structures described herein, the signal integrity is higher, there is no need to have thermometer coding, and there is reduction in pre-driver chip area and signal congestion.

Figure 1:
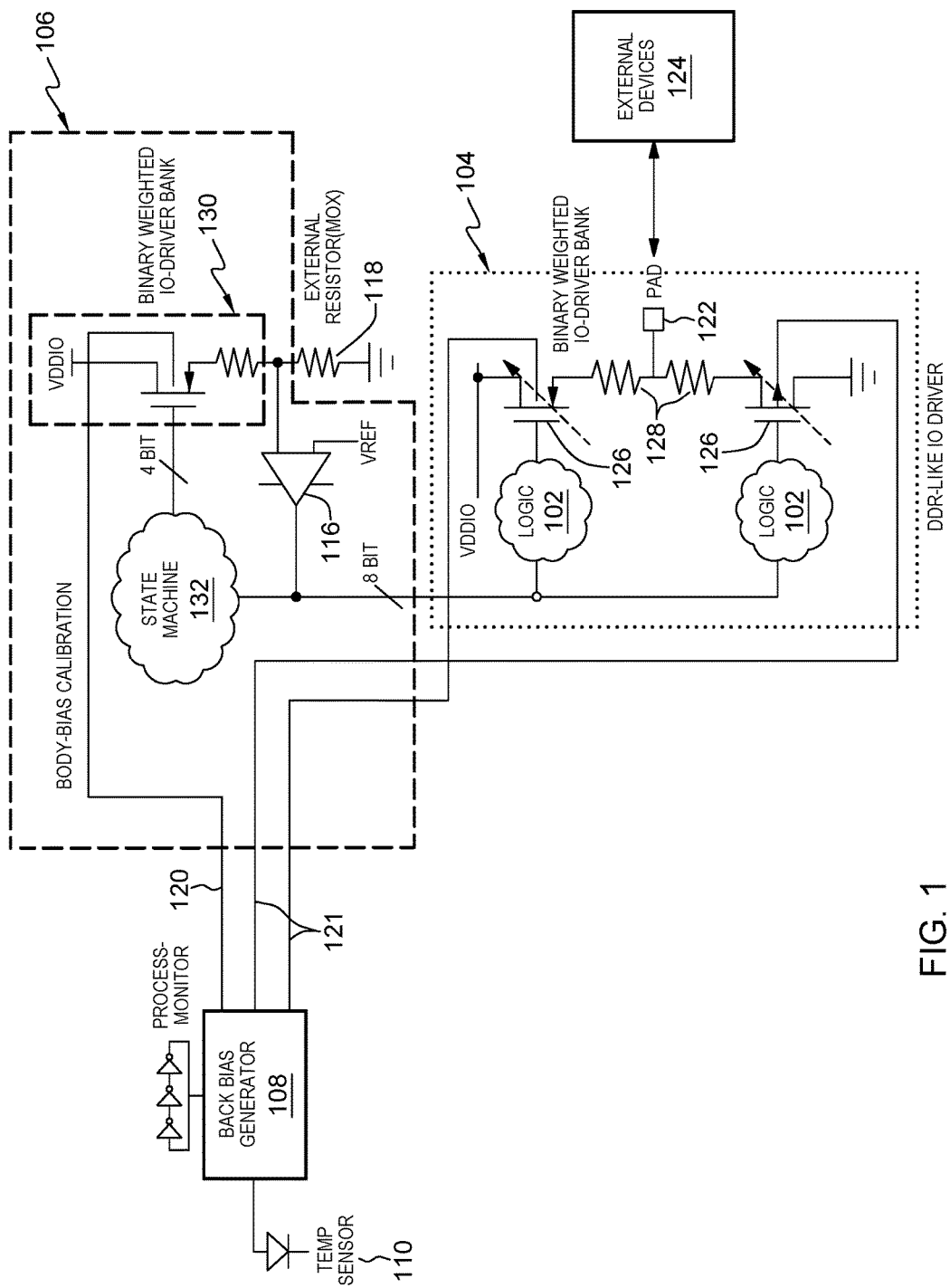
FIG. 1 is a schematic diagram illustrating a calibration I/O circuit according to embodiments herein.

As shown in FIG. 1, exemplary integrated circuit devices herein include (among other components) logic circuitry 102 receiving and generating data signals, and an input/output driver 104 electrically connected to the logic circuitry 102. The input/output driver 104 has transmit and receive terminals 122 that transmit and receive the data signals to and from the logic circuitry 102, where the data signals are communicated between the logic circuitry 102 and external devices 124, through the transmit and receive terminals 122.

These structures also include a calibration circuit 106 electrically connected to the input/output driver 104, a voltage bias generator 108 electrically connected to the calibration circuit 106 and the input/output driver 104, and a temperature sensor 110 electrically connected to the voltage bias generator 108. The calibration circuit 106 includes a comparator 116 electrically connected to the switches 114 (FIG. 2) of the calibration circuit 106 and to a reference resistor 118 (a fixed impedance). A state machine 132 is electrically connected to the calibration circuit 106 to electronically store values determined by the comparator 116 and to set the output of the voltage bias generator 108.

As shown in FIG. 1, the calibration circuit 106 and the input/output driver 104 each includes a bank of resistors 130. Briefly referring to FIG. 2, which shows an exemplary bank of resistors 130 in greater detail, the bank of resistors 130 is at least one binary weighted bank, that includes resistors $112_0$-$112_N$, and corresponding switches 114. The resistors $112_0$-$112_N$ are binary weighted, meaning that each successive resistor (e.g., resistor $112_1$) has more resistance than the previous resistor (e.g., resistor $112_0$), such that connection of a more resistive resistor may increase overall resistance sufficiently to allow one or more less resistive resistors to be disconnected, while increasing overall resistance of the bank of resistors 130.

As also shown in FIG. 1, the input/output driver 104 (which can be, for example, a double data rate (DDR), or similar, input/output driver) includes switches 126 connected to the separate logic devices 102. Note that the logic devices 102 are not necessarily a component of the input/output driver 104, but are shown within the input/output driver 104 for convenience of illustration. The input/output driver 104 includes differential resistors 128 connected to the switches 126, such that activation of the switches 126 distinguishes which of the differential resistors 128 are connected to, and receive/send data to/from, the transmit and receive terminals 122.

The switches 114, 126 can be any appropriate device that can turn off or on current, such as transistors, and more specifically for example, fully depleted transistors, etc. In one example, structures herein take advantage of fully depleted transistor devices (FDX), which include an undoped semiconductor layer that has a smaller thickness than a channel depletion width. Thus, the electric charge and, accordingly, the body potential of the field effect transistor is fixed, which is helpful for avoiding or at least reducing the floating body effect and for improving channel controllability using external biasing.

Figure 2:
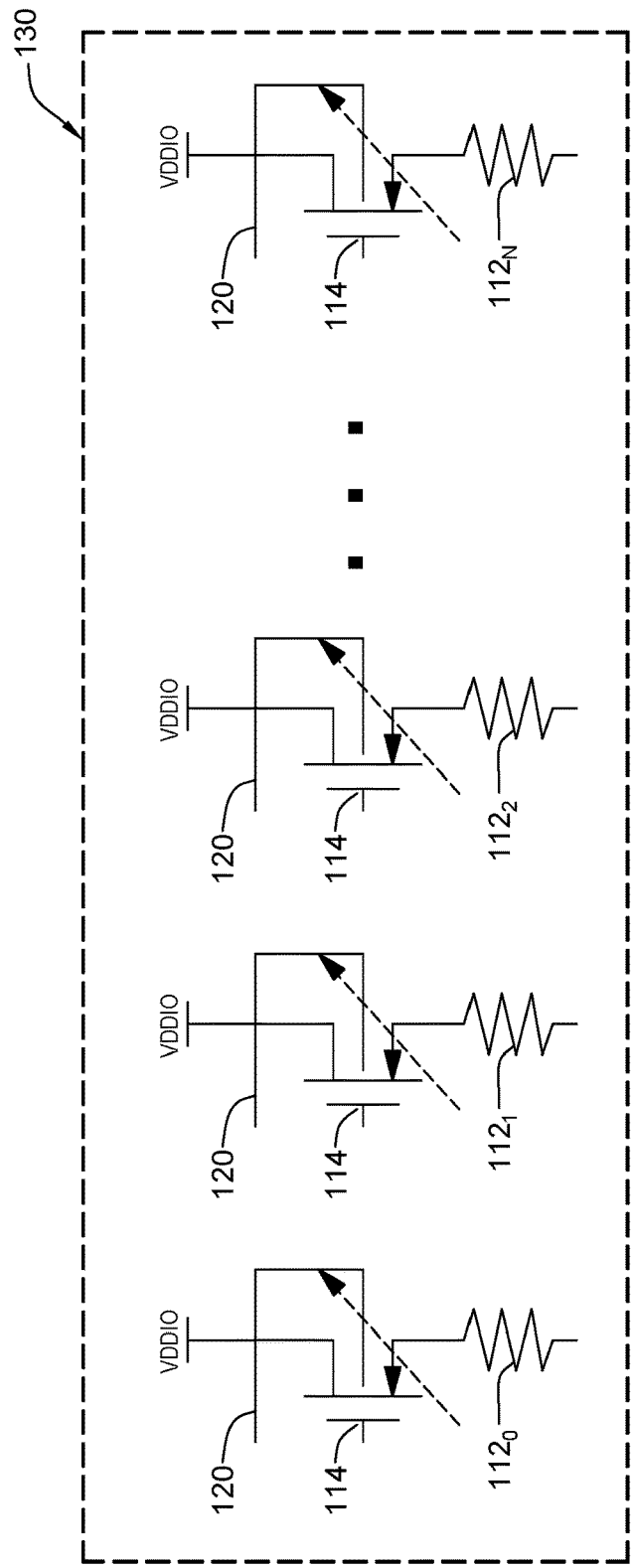
FIG. 2 is a schematic diagram illustrating a portion of the circuit shown in FIG. 1.

In greater detail, the bank of resistors 130 of the calibration circuit 106 is identical to the differential resistors 128 of the input/output driver 104. During an initial (powering up) calibration operation, the state machine 132 incrementally connects ones of the resistors $112_0$-$112_N$, by enabling/disabling (turning on/off) corresponding switches 114 until the comparator 116 indicates that the resistance of the bank of resistors 130 matches the resistance of the reference resistor 118. This specific pattern of connected and disconnected resistors is then applied by the state machine 132 to the differential resistors 128 of the other I/O driver(s) through logic elements 102, so that all input/output drivers 104 will have the same resistance (impedance) as the calibration circuit 106 (which matches the reference resistor 118). As shown in FIGS. 1 and 2, the comparator 116 is therefore used to activate or deactivate selected ones of the switches 114 and 126, which thereby connect or disconnects selected ones of the corresponding resistors $112_0$-$112_N$ and 128. In some structures, the input/output driver 104 and the calibration circuit 106 are positioned on one substrate, but the reference resistor 118 is on a different substrate separate from that one substrate to prevent the reference resistor 118 from being affected by the heat experienced by the input/output driver 104 and the calibration circuit 106.

Therefore, during a powering-up (startup) operation the comparator 116 is used to activate or deactivate selected ones of the switches 114 in the calibration circuit 106 (to connect or disconnect selected ones of the corresponding resistors $112_0$-$112_N$) until the resistance of each of the bank of resistors 130 in the calibration circuit 106 matches the resistance of the reference resistor 118. The startup setting value, designating which of the resistors $112_0$-$112_N$ are connected through the switches 114 (which is customarily a binary value (e.g., 0110)), is stored in an electronic memory (such as a state machine 132) and provided to the input/output driver 104 to have all switches 126 in the input/output driver(s) 104 be similarly enabled. This allows each of the input/output drivers 104 to have the same impedance as the calibration circuit 106 (because the calibration circuit 106 is a duplicate of the input/output drivers 104).

The powering-up operation is distinguished from input/output operations, because the powering-up operation takes place immediately after power has been supplied to the calibration circuit 106 and input/output driver 104 (e.g., within the first few seconds, or fractions of a second after power is supplied); while, in contrast, input/output operations are performed after the powering-up operation has finished (e.g., after the first few seconds, or fractions of a second that power is supplied). During input/output operations, the transmit and receive terminals 122 send and receive data signals while, in contrast, send or receive data signals are not sent or received to/from the transmit and receive terminals 122 during the powering-up operations.

Note that the calibration circuit 106 does not perform input/output operations because the calibration circuit 106 is only used for calibration; however the calibration circuit 106 is physically located with the input/output driver(s) 104 and experiences the same temperature that the input/output driver(s) 104 experience. Therefore, the resistance/impedance of the calibration circuit 106 will change identically with the input/output driver(s) 104 as the temperature changes. Additionally, the operating temperature of the calibration circuit 106 and input/output driver 104 are generally lower during the powering-up operation because the process of sending and receiving data signals during the input/output operations generates heat, which similarly increases the operating temperature of the calibration circuit 106 and input/output driver 104. However, because the reference resistor 118 is physically separated from the calibration circuit 106 and input/output driver(s) 104, the reference resistor 118 does not experience the temperature change that the calibration circuit 106 and input/output driver 104 experience (the reference resistor 118 is thermally insulated from such temperature change).

As shown in FIGS. 1 and 2, the bodies of the switches 114, 126 are electrically connected to the voltage bias generator 108, and the switches 114 are biased by a bias signal 120 output from the voltage bias generator 108. The "body" of a switch is an element that affects the channel region of a transistor, and is different from the source/drain regions, the gate, or the channel. Therefore, the "body" can be the substrate upon which the transistor is formed, can be a back gate of the transistor, etc., and by changing the voltage of the "body" of the transistor, the threshold voltage (Vt) and current flow characteristics (impedance) of the transistor are changed.

The voltage bias generator 108 adjusts the bias signal 120 when a temperature change is sensed by the temperature sensor 110 during the input/output operations (after the powering-up operation is completed). Specifically, the voltage bias generator 108 (in response to a temperature change output by the temperature sensor 110 that exceeds a temperature change threshold) starts a calibration operation by sweeping the voltage of the bias signal 120 until the output impedance of the bank of resistors 130 in the calibration circuit 106 matches the impedance of the reference resistor 118 (as detected by the comparator 116). In other words, during a temperature change induced calibration operation, the bias generator 108 begins at a beginning voltage (e.g., 0V) and incrementally increases the bias voltage until the resistance/impedance of the bank of resistors 130 in the calibration circuit 106 matches the resistance of the external resistor 108, and the bias generator 108 stores that voltage value (for example, in the state machine 132). This is performed without connecting or disconnecting any of the resistors 112. Once the resistance/impedance of the bank of resistors 130 and the reference resistor 118 match, the body bias voltage 121 can then set the state machine 132, which controls the voltage bias generator 108 to output the newly established body bias voltage 121 to all input/output drivers 104. The calibration is linear in nature to compensate for temperature variations.

Figure 3:
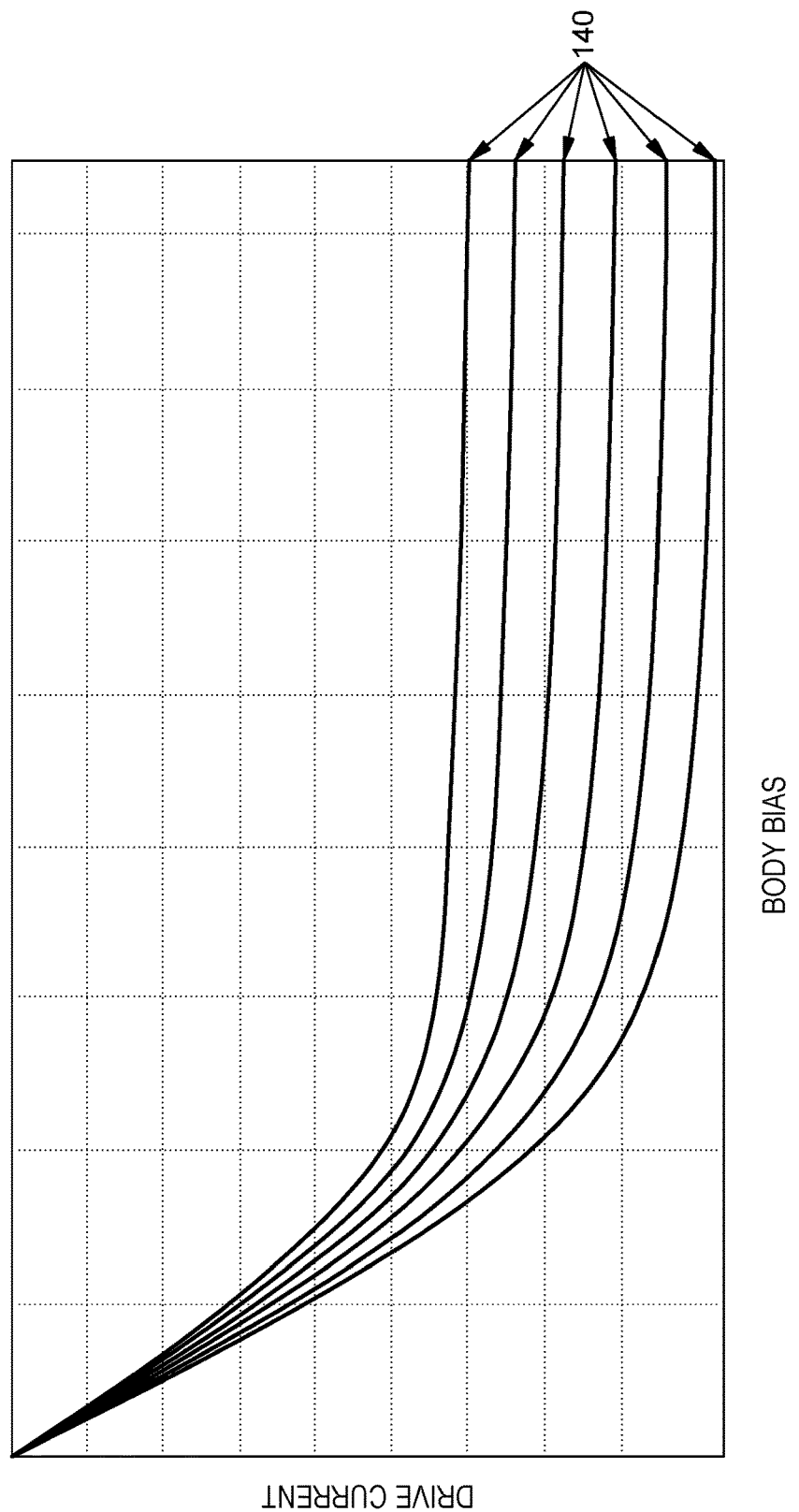
FIG. 3 is a chart showing drive current calibration variation produced by structures herein.

The switches 114, 126 change current flow as they are biased differently by the changing voltage of the bias signal 120 and the body bias voltage 121 (after the powering-up operation is completed). For example, FIG. 3 illustrates various different currents 140 that will flow through a transistor as the transistor is biased differently. This change in the current flow caused by voltage changes in the bias signal 120 adjusts how the calibration circuit 106 calibrates the input/output driver 104 in a calibration operation, without changing which of the switches 114 are activated or deactivated. For example, as the temperature sensor 110 detects an increase in temperature from the heat generated by the input/output operations, the voltage bias generator 108 changes the bias signal 120 (increases or decreases voltage) so that more or less current will flow through the switches 114, 126 to the resistors $112_0$-$112_N$, 128, thereby compensating for the temperature change to maintain consistent impedance of the I/O driver 104. In one example, as temperature is increased, current can be increased, vice-versa, or other relationships can be established, etc.

Therefore, the comparator 116 is used to activate and deactivate the switches 114 only when the input/output driver 104 is performing a powering-up (startup) operation, and before input/output operations are performed; however, the voltage bias generator 108 uses the comparator 116 to adjust the bias signal 120 based on temperature changes that occur after the input/output driver 104 has completed the powering-up (startup) operation and is performing input/output operations. In other words, none of the switches 114 are activated or deactivated after the powering-up operation has been completed, because the change in current flow through the resistors $112_0$-$112_N$ caused by changes in the bias signal 120 adjusts for different temperature conditions. By not changing switches 114 during input/output operations (and instead only increasing/decreasing voltage of the bias signal 120) the devices herein avoid noise that can be induced when switches 114 are changed during input/output operations.

Figure 4:
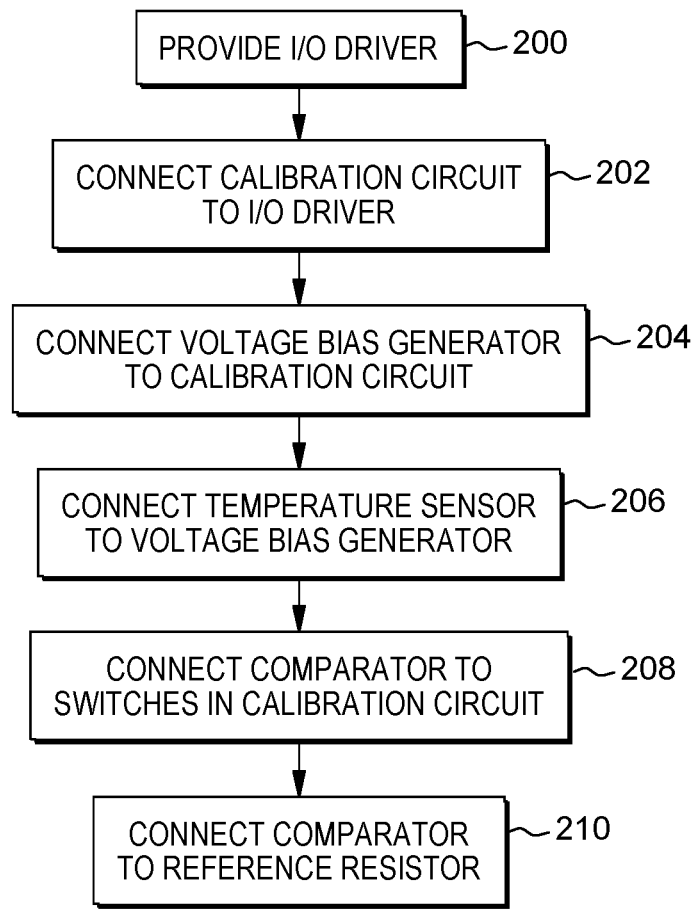
FIG. 4 is a flowchart showing method embodiments herein.

As shown in flowchart form in FIG. 4, various methods herein include (among other processes) a step of providing an input/output driver (item 200), which again can be, for example, a DDR, or similar, input/output driver. In item 202, these methods connect a calibration circuit to the input/ output driver. The calibration circuit and the input/output driver each includes a bank of resistors (e.g., binary weighted bank) and corresponding switches. Such methods also connect a voltage bias generator to the calibration circuit and the input/output driver, in item 204, by connecting bodies of the switches to the voltage bias generator. During input/output operations, the switches are biased by a bias signal output from the voltage bias generator.

Further, in item 206, these methods connect a temperature sensor (e.g., thermometer device) to the voltage bias generator, connect a comparator device (e.g., operational amplifier, etc.) to the switches of the calibration circuit in item 208, and connect the comparator to a reference resistor in item 210. When forming such connections, the input/output driver and the calibration circuit can be positioned on a first substrate, and the reference resistor can be positioned on a different substrate separate from the first substrate.

As noted above, the comparator device is used to match the resistance of the calibration circuit to the resistance of the reference resistor. The voltage bias generator adjusts the bias signal when a temperature change is sensed by the temperature sensor, and changes current flow in the switches as the bias signal changes. Thus, the change in the current flow caused by changes in the bias signal adjusts how the calibration circuit calibrates the input/output driver for temperature changes that occur during input/output operations, without changing which of the switches are activated or deactivated.

Activation and deactivation of the switches occurs only when the input/output driver is performing a powering up operation, but the voltage bias generator adjusts the bias signal based on temperature changes that occur after the input/output driver has completed the powering up operation. Thus, none of the switches are activated or deactivated after the input/output driver has completed the powering up operation.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between the source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can be any material appropriate for the given purpose (whether now known or developed in the future) and can be, for example, silicon-based wafers (bulk materials), ceramic materials, organic materials, oxide materials, nitride materials, etc., whether doped or undoped. The "shallow trench isolation" (STI) structures are generally formed by patterning openings/trenches within the substrate and growing or filling the openings with a highly insulating material (this allows different active areas of the substrate to be electrically isolated from one another).

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The terminology used herein is for the purpose of describing particular embodiments only and is not intended to be limiting of the foregoing. As used herein, the singular forms "a," "an," and "the" are intended to include the plural forms as well, unless the context clearly indicates otherwise.

Each respective figure, in addition to illustrating methods of and functionality of the present embodiments at various stages, also illustrates the logic of the method as implemented, in whole or in part, by one or more devices and structures. Such devices and structures are configured to (i.e., include one or more components, such as resistors, capacitors, transistors and the like that are connected to enable the performing of a process) implement the method described above. In other words, one or more computer hardware devices can be created that are configured to implement the method and processes described herein with reference to the figures and their corresponding descriptions.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. An integrated circuit device comprising:
an input/output driver;
a calibration circuit electrically connected to the input/output driver;
a voltage bias generator electrically connected to the calibration circuit and the input/output driver;
a temperature sensor electrically connected to the voltage bias generator, wherein the calibration circuit and the input/output driver each comprise a bank of resistors and corresponding switches, wherein bodies of the switches are electrically connected to the voltage bias generator, and wherein the switches are biased by a bias signal output from the voltage bias generator; and
a comparator device electrically connected to the calibration circuit and to a reference resistor, wherein the comparator device matches a resistance of the calibration circuit to the reference resistor, wherein the voltage bias generator adjusts the bias signal when a temperature change is sensed by the temperature sensor, and wherein the switches change current flow as the bias signal changes without changing which of the switches are activated and deactivated.

2. The integrated circuit device according to claim 1, wherein the change in the current flow caused by the bias signal changes adjusts how the calibration circuit calibrates the input/output driver.

3. The integrated circuit device according to claim 1, wherein activation and deactivation of one of the switches is performed during a powering up operation, and wherein the voltage bias generator adjusts the bias signal based on temperature changes that occur after the input/output driver has completed the powering up operation.

4. The integrated circuit device according to claim 3, wherein none of the switches are activated or deactivated after the input/output driver has completed the powering up operation.

5. The integrated circuit device according to claim 1, wherein the input/output driver and the calibration circuit are on a first substrate, and wherein the reference resistor is on a different substrate separate from the first substrate.

6. The integrated circuit device according to claim 1, wherein the bank of resistors comprises a binary weighted bank.

7. The integrated circuit device according to claim 1, wherein the reference resistor has a fixed impedance.

8. An integrated circuit device comprising:
logic circuitry receiving and generating data signals;
an input/output driver electrically connected to the logic circuitry, wherein the input/output driver has transmit and receive terminals that transmit and receive the data signals to and from the logic circuitry;
a calibration circuit electrically connected to the input/output driver;
a voltage bias generator electrically connected to the calibration circuit and the input/output driver;
a temperature sensor electrically connected to the voltage bias generator, wherein the calibration circuit and the input/output driver each comprise a bank of resistors and corresponding switches connected to each resistor of the bank of resistors, wherein bodies of the switches are electrically connected to the voltage bias generator, and wherein the switches are biased by a bias signal output from the voltage bias generator; and
a comparator device electrically connected to the calibration circuit and to a reference resistor,
wherein the comparator device matches a resistance of the calibration circuit to the reference resistor,
wherein the voltage bias generator adjusts the bias signal when a temperature change is sensed by the temperature sensor by performing a calibration operation using the calibration circuit and the reference resistor each time after the temperature change is sensed, and
wherein the switches change current flow as the bias signal changes without changing which of the switches are activated and deactivated.

9. The integrated circuit device according to claim 8, wherein the change in the current flow caused by the bias signal changes adjusts how the calibration circuit calibrates the input/output driver.

10. The integrated circuit device according to claim 8, wherein activation and deactivation of one of the switches is performed during a powering up operation, and wherein the voltage bias generator adjusts the bias signal based on temperature changes that occur after the input/output driver has completed the powering up operation.

11. The integrated circuit device according to claim 10, wherein none of the switches are activated or deactivated after the input/output driver has completed the powering up operation.

12. The integrated circuit device according to claim 8, wherein the input/output driver and the calibration circuit are on a first substrate, and wherein the reference resistor is on a different substrate separate from the first substrate.

13. The integrated circuit device according to claim 8, wherein the bank of resistors comprises a binary weighted bank.

14. The integrated circuit device according to claim 8, wherein the reference resistor has a fixed impedance.

15. A method comprising:
providing an input/output driver;
connecting a calibration circuit to the input/output driver, wherein the calibration circuit and the input/output driver each comprise a bank of resistors and corresponding switches;
connecting a voltage bias generator to the calibration circuit and the input/output driver by connecting bodies of the switches to the voltage bias generator, wherein the switches are biased by a bias signal output from the voltage bias generator;
connecting a temperature sensor to the voltage bias generator;

connecting a comparator device to the switches of the calibration circuit; and connecting the comparator device to a reference resistor, wherein the comparator device matches a resistance of the calibration circuit to a resistance of the reference resistor, wherein the voltage bias generator adjusts the bias signal when a temperature change is sensed by the temperature sensor by performing a calibration operation using the calibration circuit and the reference resistor each time after the temperature change is sensed, and wherein the switches change current flow as the temperature and the bias signal changes without changing which of the switches are activated and deactivated.

16. The method according to claim 15, wherein the change in the current flow caused by the bias signal changes adjusts how the calibration circuit calibrates the input/output driver.

17. The method according to claim 15, wherein activation and deactivation of one of the switches is performed during a powering up operation, and wherein the voltage bias generator adjusts the bias signal based on temperature changes that occur after the input/output driver has completed the powering up operation.

18. The method according to claim 17, wherein none of the switches are activated or deactivated after the input/output driver has completed the powering up operation.

19. The method according to claim 15, wherein the input/output driver and the calibration circuit are positioned on a first substrate, and wherein the reference resistor is positioned on a different substrate separate from the first substrate.

20. The method according to claim 15, wherein the bank of resistors comprises a binary weighted bank.

* * * * *